United States Patent
Cho et al.

(10) Patent No.: US 7,612,538 B2
(45) Date of Patent: Nov. 3, 2009

(54) METHOD FOR ESTIMATING SOC OF A BATTERY AND BATTERY MANAGEMENT SYSTEM USING THE SAME

(75) Inventors: Il Cho, Daejeon (KR); Do Youn Kim, Daejeon (KR); Do Yang Jung, Hwaseong-si (KR)

(73) Assignee: LG Chem, Ltd. (KR)

( * ) Notice: Subject to any disclaimer, the term of this patent is extended or adjusted under 35 U.S.C. 154(b) by 348 days.

(21) Appl. No.: 11/479,560

(22) Filed: Jun. 30, 2006

(65) Prior Publication Data

US 2007/0001649 A1 Jan. 4, 2007

(30) Foreign Application Priority Data

Jun. 30, 2005 (KR) ...................... 10-2005-0057669

(51) Int. Cl.
*H02J 7/04* (2006.01)
*H02J 7/16* (2006.01)
*H02J 7/00* (2006.01)

(52) U.S. Cl. .................. 320/150; 320/132; 320/133; 324/429

(58) Field of Classification Search .............. 320/132, 320/133, 150; 324/429
See application file for complete search history.

(56) References Cited

U.S. PATENT DOCUMENTS 5,191,291 A * 3/1993 Taylor ................... 324/429
6,157,169 A * 12/2000 Lee ....................... 320/132

FOREIGN PATENT DOCUMENTS

| JP | 2000-137062 A | 5/2000 |
| JP | 2004-515195 A | 5/2004 |
| KR | 10-2006-0098146 | 9/2006 |
| WO | WO02/42786 A3 | 5/2002 |

OTHER PUBLICATIONS

International Search Report; International Application No. PCT/KR2005/001557; International Filing Date May 27, 2005; Applicant's File Reference FPC05021-PCT; Date of Mailing Aug. 30, 2005; 3 pages.

* cited by examiner

*Primary Examiner*—Edward Tso
*Assistant Examiner*—Yalkew Fantu
(74) *Attorney, Agent, or Firm*—Cantor Colburn LLP

(57) ABSTRACT

Disclosed is a method for setting an initial SOC value, which initializes the SOC in consideration of not only the temperature change of the external environment of the battery but also the internal temperature change of the battery before the battery reaches a stable unloaded state, thereby enhancing the accuracy in the setup of the initial SOC value. The method includes: measuring internal temperatures of the battery and SOCs corresponding to voltages of the battery, which change according to the time passage after a loaded state is converted into an unloaded state, and constructing an SOC estimation table by using measured values, and storing the SOC estimation table; measuring the internal temperature and the voltage of the battery when estimation of an initial SOC value of the battery is required; and reading an SOC corresponding to the measured internal temperature and the voltage of the battery from the SOC estimation table.

6 Claims, 2 Drawing Sheets

| 1st time interval | 1st temperature | 1st battery voltage | 1st SOC |
| | | 2nd battery voltage | 2nd SOC |
| | | ... | ... |
| 2nd time interval | 2nd temperature | 1st battery voltage | Nth SOC |
| | | 2nd battery voltage | (N+1)th SOC |
| | | ... | ... |
| ... | ... | ... | ... |

METHOD FOR ESTIMATING SOC OF A BATTERY AND BATTERY MANAGEMENT SYSTEM USING THE SAME

This application claims the benefit of the filing date of Korean Patent Application No. 2005-57669, filed on Jun. 30, 2005, in the Korean Intellectual Property Office, the disclosure of which is incorporated herein in its entirety by reference.

TECHNICAL FIELD

The present invention relates to a method for setting an initial State Of Charge (SOC) value, and more particularly to a method, which can more exactly set an initial SOC value in consideration of the internal and external temperature change of the battery and the Open Circuit Voltage (OCV) change of the battery according to time passage.

BACKGROUND ART

In general, an electric automobile uses electric energy stored in a battery, for its energy source. Lithium-ion polymer batteries are widely used for such batteries of electric automobiles and are being actively researched.

Meanwhile, in the case of a gasoline automobile which uses fuel (specifically, gasoline) in order to drive its engine, there is no difficulty in measuring the quantity of fuel in the automobile. However, in the case of the electric automobile which uses a battery, it is difficult to measure the energy remaining in the battery. However, for a driver of the electric automobile, it is very important to have information about the quantity of energy currently remaining in the battery of the automobile and the distance which the automobile can drive further by the remaining energy in the battery.

That is, the electric automobile runs by using the energy charged in its battery, and it is thus very important to recognize the State Of Charge (hereinafter, referred to as "SOC") of the battery, i.e. the remaining capacity of the battery. Therefore, various technologies have developed, in order to detect the SOC of the battery during the driving and inform the driver of information about the distance which the automobile can run by the SOC, etc.

Further, there have been various trials for optimally setting an initial SOC value of the battery before the driving of the automobile. According to a typical method, the initial SOC value is set based on an Open Circuit Voltage (hereinafter, referred to as "OCV"). This method is based on an assumption that the OCV does not depend on the environment and serves as an absolute reference value for the SOC.

However, various tests and treatises have verified that the OCV does not have a fixed value regardless of the environment but has a value changing according to temperature and aging. However, the conventional method for setting an initial SOC value of the battery does not take the OCV changing according to the temperature into consideration, and it is thus impossible to estimate an exact SOC of the battery by the conventional method.

In consideration of such a problem, the applicant has proposed a method for setting an initial SOC value by using a table including OCVs and SOCs at various temperatures (Korean Patent Application No. 2005-19487). However, the proposed method is problematic in that the OCV refers to the voltage of the battery at a stable unloaded state and is thus unavailable any more after the battery is loaded. That is to say, chemical reaction occurs in the battery when the battery is in a loaded state, and the battery cannot reach the OCV state directly after an applied voltage is interrupted, but can reach a convergence state for the OCV after passage of sufficient time from the interruption of the voltage.

In other words, even when the applied load is eliminated, that is, even when the current flow is interrupted, the voltage converges to the a stable unloaded voltage or the OCV after passage of predetermined time, usually more than one hour. Therefore, if the SOC is initialized by the methods described above, hybrid electric automobiles may have the following problem.

When a driver restarts an engine of a hybrid electric automobile after passage of sufficient time after stopping the engine, it is possible to initialize the SOC in the method as described above. However, when the driver restarts the engine before passage of sufficient time after stopping the engine, the SOC is initialized by considering a voltage before reaching the OCV as the OCV, which results in occurrence of error.

In conclusion, the prior arts fail to consider environment of a device to which a battery is installed, specifically external temperature change. Further, even the prior art considering the external temperature change is problematic in that it initializes the SOC based on the voltage before the battery reaches the OCV.

DISCLOSURE OF THE INVENTION

Therefore, the present invention has been made in view of the above-mentioned problems, and it is an object of the present invention to provide a method for setting an initial SOC value, which initializes the SOC in consideration of not only the temperature change of the external environment of the battery but also the internal temperature change of the battery before the battery reaches OCV, thereby enhancing the accuracy in the setup of the initial SOC value.

In order to achieve the above object, the inventor proposes to use the internal temperature change of the battery in setting the initial SOC value. That is to say, in consideration of the fact that the battery in a loaded state has a higher internal temperature than that of the battery in a stable state, the inventor proposes to measure the internal temperature change of the battery according to the time passage after the conversion from a loaded state to an unloaded state and set an initial SOC value based on the measured change.

According to an aspect of the present invention, there is provided a method for estimating a State Of Charge (SOC) of a battery, comprising the steps of: measuring internal temperatures of the battery and SOCs corresponding to voltages of the battery, which change according to the time passage after a loaded state is converted into an unloaded state, and constructing an SOC estimation table by using measured values, and storing the SOC estimation table; measuring the internal temperature and the voltage of the battery when estimation of an initial SOC value of the battery is required; and reading an SOC corresponding to the measured internal temperature and the voltage of the battery from the SOC estimation table.

BRIEF DESCRIPTION OF THE DRAWINGS

The foregoing and other objects, features and advantages of the present invention will become more apparent from the following detailed description when taken in conjunction with the accompanying drawings in which.

BEST MODE FOR CARRYING OUT THE INVENTION

Reference will now be made in detail to the preferred embodiments of the present invention.

According to the present invention, an SOC estimation table is constructed by measuring temperature change according to passage of time, and then measuring the battery voltage and SOC at each time and temperature.

The method for forming SOC estimation table will be described with reference to FIG. 1.

First, a tester or a measurer (hereinafter, referred to as a "tester") measures the SOC, temperature, battery voltage, etc. according to the passage of time after the battery reaches the unloaded state.

When the measurement of the SOC, temperature, battery voltage, etc. according to the passage of time has been completed, the tester constructs an SOC estimation table by using the measured SOC, temperature, battery voltage, etc. according to the passage of time.

Figures 1, 2:
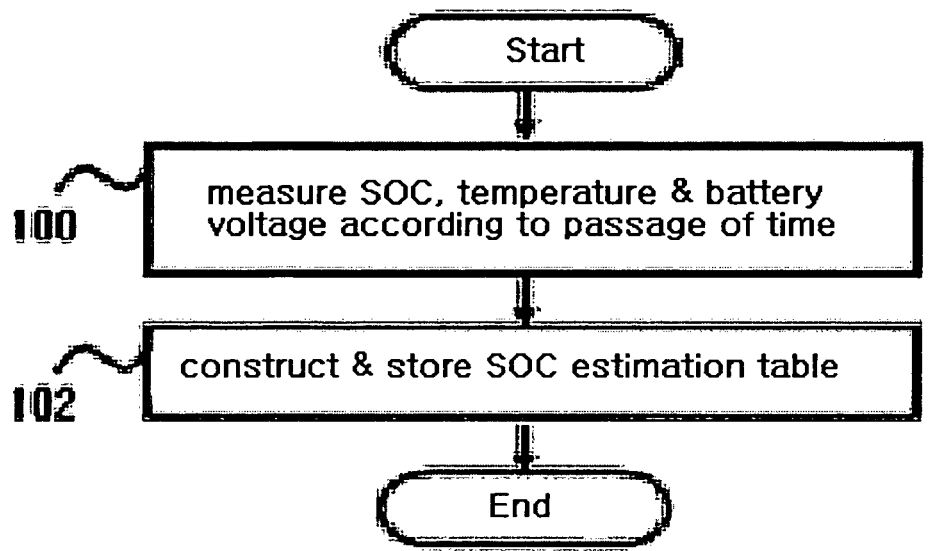
FIG. 1 is a flowchart of a method for constructing an SOC estimation table according to an embodiment of the present invention.
FIG. 2 illustrates an example of the SOC estimation table according to an embodiment of the present invention.

As noted from FIG. 2, the SOC estimation table contains the measured temperature of the battery according to the passage of time and mapped battery voltages for each SOC of the battery at each temperature.

Figure 3:
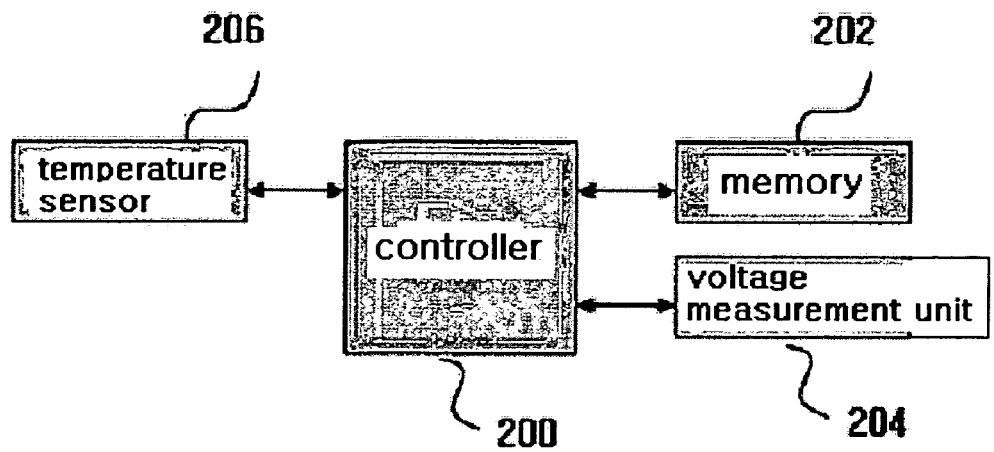
FIG. 3 is a block diagram of a battery management system according to an embodiment of the present invention.

Hereinafter, a schematic construction of a battery management system for estimating the SOC of a battery by using the SOC estimation table will be described with reference to FIG. 3.

The battery management system includes a controller 200, a memory 202, a voltage measurement unit 204, and a temperature sensor 206.

The controller 200 controls the general operation of the battery management system, and estimates the SOC by using the SOC estimation table stored in the memory 202 according to a preferred embodiment of the present invention. Especially, the estimated SOC corresponds to an initial SOC value which reflects a time interval for an unloaded state.

The memory 202 stores various information including processing programs of the controller 200. Especially, the memory 202 stores the SOC estimation table according to a preferred embodiment of the present invention.

The voltage measurement unit 204 measures a voltage of the battery under the control of the controller 200 and provides the measured voltage to the controller 200.

The temperature sensor 206 measures an internal temperature and an external temperature of the battery under the control of the controller 200 and provides the measured temperatures to the controller 200.

Figure 4:
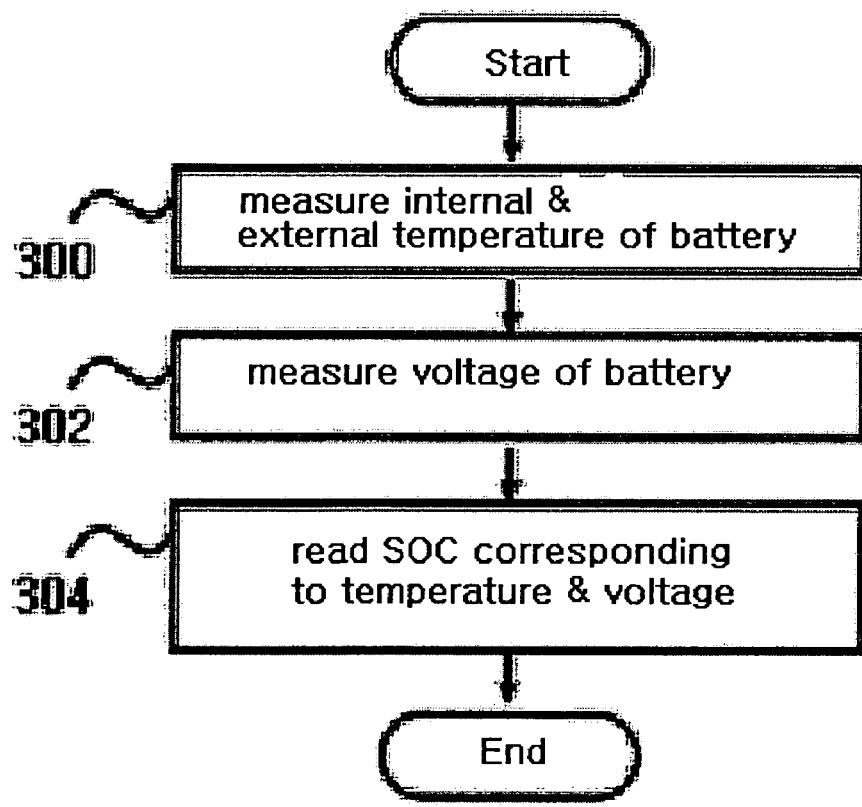
FIG. 4 is a flowchart of a method for SOC estimation according to an embodiment of the present invention.

Hereinafter, an SOC estimation method according to a preferred embodiment of the present invention, which is applicable to the battery management system, will be described with reference to FIG. 4.

When estimation of the SOC is necessary, the controller 200 controls the temperature sensor 206 to measure the internal temperature and an external temperature of the battery (step 300). The measurement of both the internal temperature and an external temperature of the battery can improve the correctness in the measurement of the internal temperature of the battery because it enables consideration of the influence of the external temperature on the internal temperature of the battery. Therefore, the controller 200 compensates for the internal temperature of the battery in consideration of the external temperature of the battery.

When the estimation of the internal temperature of the battery has been completed, the controller 200 controls the voltage measurement unit 204 to measure the voltage of the battery (step 302).

When the measurement of the voltage of the battery has been completed, the controller 200 reads an SOC corresponding to the measured internal temperature and battery voltage from the SOC estimation table stored in the memory 202 (step 304). Through this process, the estimation of the initial SOC of the battery is completed.

According to the present invention as described above, the initial SOC value is neither set by referring to only a fixed open circuit voltage nor is estimated by using an open circuit voltage measured only in consideration of an external temperature. However, according to the present invention, the initial SOC value is estimated or set in consideration of the internal temperature change of the battery and the battery voltage during the process in which the battery reaches a stable unloaded state from a loaded state. Therefore, it is possible to estimate a more accurate SOC value by the present invention.

INDUSTRIAL APPLICABILITY

As can be seen from the foregoing, according to the present invention provides, setup of the initial SOC value is performed in consideration of the external temperature change and the internal temperature change of the battery during time delay of the battery for converging to the stable unloaded state of the battery. Therefore, it is possible to prevent occurrence of error due to disregard of the temperature change in and out of the battery, thereby achieving setup of a more accurate SOC value.

While this invention has been described in connection with what is presently considered to be the most practical and preferred embodiment, it is to be understood that the invention is not limited to the disclosed embodiment and the drawings, but, on the contrary, it is intended to cover various modifications and variations within the spirit and scope of the appended claims.

The invention claimed is:

1. A method for estimating an initial State Of Charge (SOC) of a battery, comprising the steps of:
   (1) measuring internal temperatures of the battery according to a time passage after a loaded state is converted into an unloaded state, and SOCs corresponding to a plurality of voltages of the battery at each measured internal temperature of the battery, and constructing an SOC estimation table by using measured values, and storing the SOC estimation table;
   (2) measuring the internal temperature and the voltage of the battery when estimation of the initial SOC value of the battery is required after a loaded state is converted into an unloaded state; and
   (3) determining the initial SOC corresponding to the measured internal temperature and the voltage of the battery by referring to the SOC estimation table.

2. The method according to claim 1, wherein, in step (2), an external temperature of the battery is measured together with the internal temperature of the battery, and the internal temperature of the battery is then compensated for in consideration of the external temperature of the battery.

3. The method according to claim 1, wherein, in the SOC estimation table, the internal temperatures of the battery and the SOCs corresponding to the voltages of the battery are mapped based on a predetermined time interval.

4. A battery management system comprising:

a memory for storing an SOC estimation table which is constructed by measuring internal temperatures of the battery according to a time passage after a loaded state is converted into an unloaded state, and SOCs corresponding to a plurality of voltages of the battery at each measured internal temperature of the battery;

a voltage measurement unit for measuring a voltage of the battery;

a temperature sensor for measuring an internal temperature of the battery; and a controller for measuring the internal temperature and the voltage of the battery when estimation of an initial SOC value of the battery is required after a loaded state is converted into an unloaded state, and then determining the initial SOC corresponding to the measured internal temperature and the voltage of the battery by referring to the SOC estimation table.

5. The battery management system according to claim 4, wherein the temperature sensor measures the internal temperature and the external temperature of the battery, and the controller compensates for the internal temperature of the battery based on the external temperature of the battery.

6. The battery management system according to claim 4, wherein, in the SOC estimation table, the internal temperatures of the battery and the SOCs corresponding to the voltages of the battery are mapped based on a predetermined time interval.

* * * * *